(12) United States Patent
Huang et al.

(10) Patent No.: US 7,521,304 B1
(45) Date of Patent: Apr. 21, 2009

(54) METHOD FOR FORMING INTEGRATED CIRCUIT

(75) Inventors: Richard J. Huang, Cupertino, CA (US); Scott A. Bell, San Jose, CA (US); Srikanteswara Dakshina-Murthy, Austin, TX (US); Philip A. Fisher, Foster City, CA (US); Richard C. Nguyen, Fremont, CA (US); Cyrus E. Tabery, Sunnyvale, CA (US); Lu You, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 300 days.

(21) Appl. No.: 10/230,775

(22) Filed: Aug. 29, 2002

(51) Int. Cl.
*H01L 21/336* (2006.01)

(52) U.S. Cl. ................... 438/197; 438/585

(58) Field of Classification Search ........... 438/197, 438/585
See application file for complete search history.

(56) References Cited

U.S. PATENT DOCUMENTS

| | | | |
|---|---|---|---|
| 4,382,100 A | 5/1983 | Holland | |
| 5,185,293 A | 2/1993 | Franke et al. | |
| 5,385,762 A | 1/1995 | Prins | |
| 5,656,128 A * | 8/1997 | Hashimoto et al. | 216/47 |
| 5,679,608 A | 10/1997 | Cheung et al. | |
| 5,721,090 A | 2/1998 | Okamoto et al. | |
| 5,759,746 A | 6/1998 | Azuma et al. | |
| 5,776,602 A | 7/1998 | Ueda et al. | |
| 5,801,399 A * | 9/1998 | Hattori et al. | 257/69 |
| 5,837,357 A | 11/1998 | Matsuo et al. | |
| 5,891,575 A | 4/1999 | Marchywka et al. | |
| 5,981,398 A * | 11/1999 | Tsai et al. | 438/710 |
| 6,030,541 A | 2/2000 | Adkisson et al. | |
| 6,121,158 A | 9/2000 | Benchikha et al. | |
| 6,140,200 A | 10/2000 | Eldridge | |
| 6,171,343 B1 | 1/2001 | Dearnaley et al. | |
| 6,350,390 B1 | 2/2002 | Liu et al. | |
| 6,365,320 B1 | 4/2002 | Foote et al. | |
| 6,368,924 B1 | 4/2002 | Mancini et al. | |
| 6,388,924 B1 | 5/2002 | Nasu | |
| 6,413,852 B1 | 7/2002 | Grill et al. | |
| 6,428,894 B1 | 8/2002 | Babich et al. | |
| 6,573,030 B1 | 6/2003 | Fairbairn et al. | |
| 6,596,553 B1 | 7/2003 | Lin et al. | |
| 6,673,684 B1 | 1/2004 | Huang et al. | |
| 6,682,996 B1 * | 1/2004 | Blosse | 438/586 |
| 6,750,127 B1 | 6/2004 | Chang et al. | |

OTHER PUBLICATIONS

Yamaguchi, A. et al., "Ar Ion implantation into Resist For Etching Resistance Improvement", Proceedings of SPIE vol. 4345 (2001), pp. 655-664.

(Continued)

*Primary Examiner*—Jack Chen
(74) *Attorney, Agent, or Firm*—Foley & Lardner LLP

(57) ABSTRACT

A method of forming an integrated circuit includes providing a buffer layer comprising a dielectric material above a layer of conductive material and providing a layer of mask material above the buffer layer. The mask material comprises amorphous carbon. The method also includes removing a portion of the buffer layer and the layer of mask material to form a mask. A feature is formed in the layer of conductive material according to the mask.

26 Claims, 5 Drawing Sheets

OTHER PUBLICATIONS

Borzenko, V. et al., "The Effect of Ion Implantation On Polymer Mask Resistance To Ion Beam Etching", Vacuum, 38, 1007 (1988), pp. 1007-1009.

R. Gago, et al., "Bonding and hardness in nonhydrogenated carbon films with moderate $sp^3$ content", Journal of Applied Physics, vol. 87, No. 11, Jun. 1, 2000, 7 pgs.

Wolf, S., Tauber, R. N., "Silicon Processing For the VLSI Era", Lattice Press, Sunset Beach, CA; 1986; pp. 322, 384-385, 556-557, vol. 1.

U.S. Appl. No. 10/215,173, entitled "Use of Amorphous Carbon Hard Mask for Gate Patterning to Eliminate Requirement of Poly Re-Oxidation", as filed on Aug. 8, 2002, including claims, drawings, and abstract (29 pages).

U.S. Appl. No. 10/277,760, entitled "Sacrificial Air Gap Layer for Insulation of Metals", filed Aug. 8, 2002, including claims, drawings, and abstract (17 pages).

U.S. Appl. No. 10/244,650, entitled "Use of Multilayer Amorphous Carbon Arc Stack to Eliminate Line Warpage Phenomenon", filed Sep. 16, 2002, including claims, drawings, and abstract (30 pages).

U.S. Appl. No. 10/217,730, entitled "Ion Implantation to Modulate Amorphous Carbon Stress", filed Aug. 13, 2002, including claims, drawings, and abstract (29 pages).

U.S. Appl. No. 10/424,420, entitled "Use of Amorphous Carbon for Gate Patterning", filed Aug. 28, 2003, by Fisher et al.

U.S. Appl. No. 10/230,794, entitled "Formation of Amorphous Carbon Arc Stack Having Graded Transition Between Amorphous Carbon and Arc Material", filed Aug. 29, 2002, including claims, drawings, and abstract (29 pages).

U.S. Appl. No. 10/335,726, entitled "Use of Diamond as a Hard Mask Material", filed Jan. 2, 2003, including claims, drawings, and abstract (26 pages).

U.S. Appl. No. 10/424,675, entitled "Selective Stress-Inducing Implant and Resulting Pattern Distortion in Amorphous Carbon Patterning", filed Apr. 28, 2003, including claims, drawings, and abstract (28 pages).

U.S. Appl. No. 10/445,129, entitled "Modified Film Stack and Patterning Strategy for Stress Compensation and Prevention of Pattern Distortion in Amorphous Carbon Gate Patterning", filed May 20, 2003, including claims, drawings, and abstract (29 pages).

* cited by examiner

METHOD FOR FORMING INTEGRATED CIRCUIT

CROSS-REFERENCE TO RELATED PATENT APPLICATIONS

This application is related to U.S. patent application Ser. No. 10/215,173 entitled "Use of Amorphous Carbon Hard Mask for Gate Patterning to Eliminate Requirement of Poly Re-Oxidation," U.S. patent application Ser.No. 10/277,760 entitled "Sacrificial Air Gap Layer for Insulation of Metals," U.S. patent application Ser. No. 10/244,650 entitled "Use of Multilayer Amorphous Carbon Arc Stack to Eliminate Line Warpage Phenomenon," U.S. patent application Ser. No. 10/424,420 entitled "Use of Amorphous Carbon for Gate Patterning," U.S. patent application Ser. No. 10/230,794 entitled "Formation of Amorphous Carbon ARC Stack Having Graded Transition Between Amorphous Carbon and ARC Material," U.S. patent application Ser. No. 10/335,726 entitled "Use of Diamond as a Hard Mask Material," U.S. patent application Ser. No. 10/424,675 entitled "Selective Stress-Inducing Inplant and Resulting Pattern Distortion in Amorphous Carbon Patterning," U.S. patent application Ser. No. 10/445,129 entitled "Modified Film Stack and Patterning Strategy for Stress Compensation and Prevention of Pattern Distortion in Amorphous Carbon Gate Patterning," and U.S. patent application Ser. No. 10/217,730 entitled "Ion Implantation to Modulate Amorphous Carbon Stress," each of which is assigned to the assignee of the present application.

FIELD OF THE INVENTION

The present invention relates generally to the field of integrated circuits and methods of manufacturing integrated circuits. More particularly, the present invention relates to the use of masks formed of amorphous carbon to form features in integrated circuits.

BACKGROUND OF THE INVENTION

Deep-submicron complementary metal oxide semiconductor (CMOS) is conventionally the primary technology for ultra-large scale integrated (ULSI) circuits. Over the last two decades, reduction in the size of CMOS transistors has been a principal focus of the microelectronics industry.

Transistors (e.g., MOSFETs), are often built on the top surface of a bulk substrate. The substrate is doped to form source and drain regions, and a conductive layer is provided between the source and drain regions. The conductive layer operates as a gate for the transistor; the gate controls current in a channel between the source and the drain regions.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. Conventional processes typically utilize polysilicon based gate conductors because metal gate conductors are difficult to etch, are less compatible with front-end processing, and have relatively low melting points. The transistors can be N-channel MOSFETs or P-channel MOSFETs.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

As critical dimensions (CDs) of device structures are made smaller, certain issues must be addressed during processing. One such issue involves the use of a wet etch to remove mask layers used in the formation of the structures. When structures having small critical dimensions are produced, the introduction of phosphoric acid or other aqueous etchants to remove a mask layer may damage the structure formed during the etching process.

Another issue that must be addressed is that the shape integrity of the structures formed may be lessened where the materials used to form the mask layer include an internal stress. For example, where a mask material includes an internal compressive or tensile stress by virtue of the microstructure of the material, under certain conditions the mask material may deform. The deformed mask layer will then transfer the deformed pattern into the underlying material when the mask is used during an etch or material removal step. This phenomenon is sometimes referred to as line warpage or "wiggle." For example, conductive lines formed that exhibit warpage or wiggle characteristics may appear as a serpentine or curving structure. The warpage or wiggle of the line may increase the distance that electrons must travel through the conductive line (and hence increase the resistance of the conductive line) when compared to conductive lines that do not exhibit warpage or wiggle characteristics.

A related issue to the warpage issue described above is the presence of a stress mismatch between certain mask materials and an underlying conductive (e.g., polysilicon, etc.) layer. The internal stress characteristics of the mask material and the conductive layer may result in delamination or warpage of the mask and any features formed in accordance with the mask.

Thus, there is a need to form structures in an integrated circuit using an improved method that produces structures having reduced critical dimensions. Further, there is a need to improve the shape integrity of structures formed during manufacturing (e.g., reducing or eliminating conductive line warpage, etc.). Even further, there is a need to use amorphous carbon as a mask in the formation of integrated circuit structures. Even further still, there is a need to reduce the amount of stress mismatch between a mask material and an underlying conductive layer that is patterned in accordance with the mask.

SUMMARY OF THE INVENTION

An exemplary embodiment relates to a method of forming an integrated circuit. The method includes providing a buffer layer comprising a dielectric layer above a layer of conductive material. The method also includes providing a layer of mask material comprising amorphous carbon above the buffer layer. The method further includes removing a portion of the buffer layer and the layer of mask material to form a mask and forming a feature in the layer of conductive material according to the mask.

Another exemplary embodiment relates to a method of forming features in an integrated circuit. The method includes forming a mask above a layer of polysilicon. The mask including a first region comprising a dielectric material, a second region comprising amorphous carbon above the first region, and a third region comprising an anti-reflective coating (ARC) material above the second region. The method also includes forming a feature in the layer of polysilicon according to the mask and removing the mask.

A further exemplary embodiment relates to an integrated circuit produced by a method that includes providing a conductive material layer above a semiconductor substrate. The method also includes forming a layer of buffer material above comprising a dielectric material above the conductive material layer. The method further includes depositing a layer of amorphous carbon material above the layer of buffer material. The method further includes etching the amorphous carbon layer and the layer of buffer material to form a hard mask and etching the conductive material layer according to the hard mask.

Other principal features and advantages will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
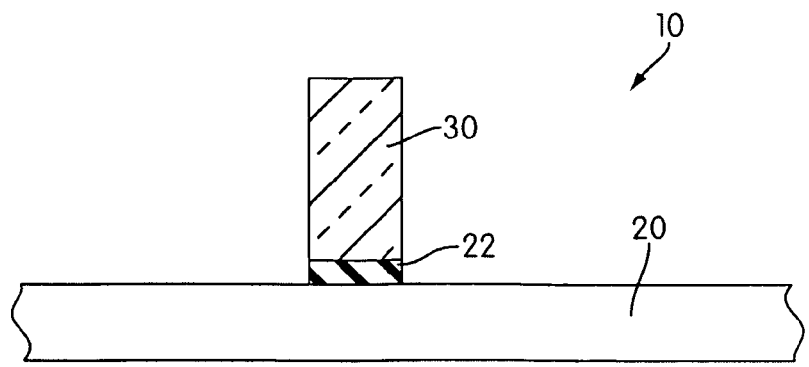
FIG. 1 is a schematic cross-sectional view of a portion of an integrated circuit fabricated in accordance with an exemplary embodiment.

Referring to FIG. 1, a portion 10 of an integrated circuit (IC) includes a substrate layer 20, an oxide or dielectric layer 22, and a line or gate conductor 30. Portion 10 is preferably part of an ultra-large-scale integrated (ULSI) circuit having a million or more transistors, and is manufactured as part of the IC on a wafer made of a semiconducting material (e.g., silicon, gallium arsenide, etc.).

Conductive line 30 can be a metal, a polysilicon, or polysilicon/germanium ($Si_xGe_{(1-x)}$) material that controls charge carriers in a channel region formed between source and drain regions in substrate 20 to turn the transistor on and off. Conductive line 30 may be doped or undoped. In an exemplary embodiment, conductive line 30 is made of a polysilicon material and has a thickness between approximately 500 and 2000 angstroms and a width of between approximately 30 and 50 nanometers.

Figures 2A, 2B:
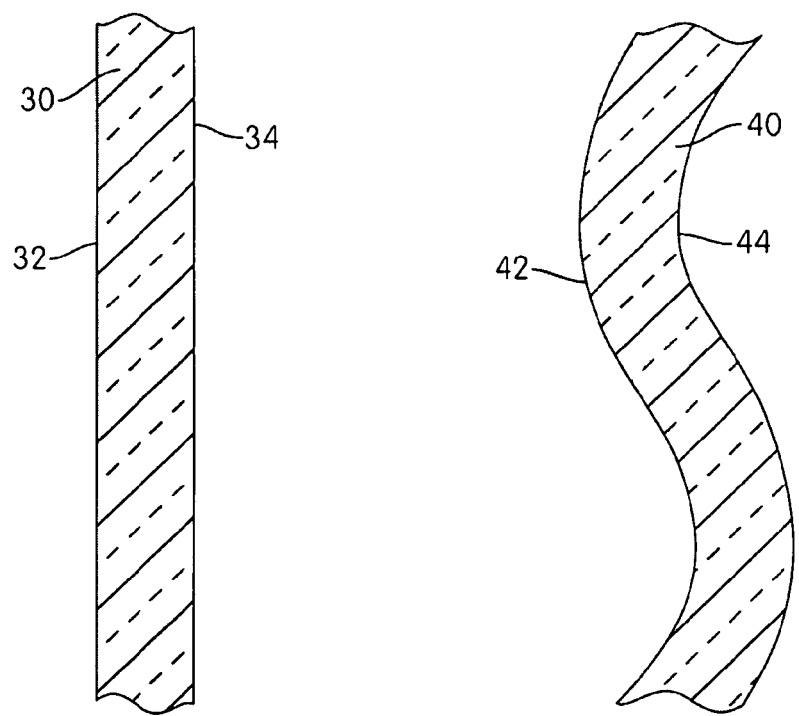
FIG. 2A is a top elevation view of the integrated circuit portion shown in FIG. 1 showing a feature formed without warpage.
FIG. 2B is a top elevation view of a feature similar to that shown in FIG. 2A showing a warpage phenomenon.

As shown in the exemplary embodiment of FIG. 2A, conductive line 30 is preferably formed using a method that maintains the shape integrity of structures formed by reducing or eliminating the phenomenon of warpage or "wiggle." In an example of a conductive line formed in an integrated circuit, one result is that the tendency to form conductive lines having a generally serpentine or curved shape along their length is reduced or eliminated.

The warpage phenomenon may be illustrated with reference to FIGS. 2A and 2B. In manufacturing integrated circuits, it is desirable to produce conductive lines that have a generally straight profile. One example of such a conductive line is shown in FIG. 2A, where the sides or lateral edges 32, 34 of conductive line 30 have a substantially straight or linear configuration along their length. In contrast to conductive line 30, FIG. 2B shows a conductive line 40 manufactured by a method that does not reduce or eliminate warpage along the length of conductive line 40. As shown, sides or edges 42, 44 are not linear, but rather include a generally curved or warped shape. The amount or magnitude of curvature may vary depending on various conditions, including the properties of the mask or patterning material used, the properties of the material being patterned or etched, and the processing conditions used during the etching operation, among others.

One material that may be used as a hard mask in the formation of integrated circuit structures having reduced critical dimensions (e.g., approximately 30-50 nanometers or less) is amorphous carbon. It has been discovered that when a layer of amorphous carbon material is patterned to provide a hard mask for features having reduced critical dimensions, shape integrity may be impaired due to the internal properties of the amorphous carbon material. One theory currently being investigated is that internal stresses (e.g., compressive or tensile stresses) in the amorphous carbon material cause the mask to deform. For example, where a layer of amorphous carbon is patterned to form a mask for a conductive line to be formed in a material underlying the mask, a cap layer or anti-reflective coating (ARC) layer may be provided above the amorphous carbon pattern. When this cap or ARC layer is removed, stresses in the amorphous carbon material may cause the mask to buckle or deform to produce a wavy or serpentine pattern. This pattern is then transferred to the conductive line material in a subsequent etching step.

A method for producing portion 10 that reduces or eliminates warpage in the formation of conductive line 30 will now be described with reference to FIGS. 3 to 8. FIG. 9 is a flow diagram that outlines a process 200 used in the formation of portion 10.

Figure 3:
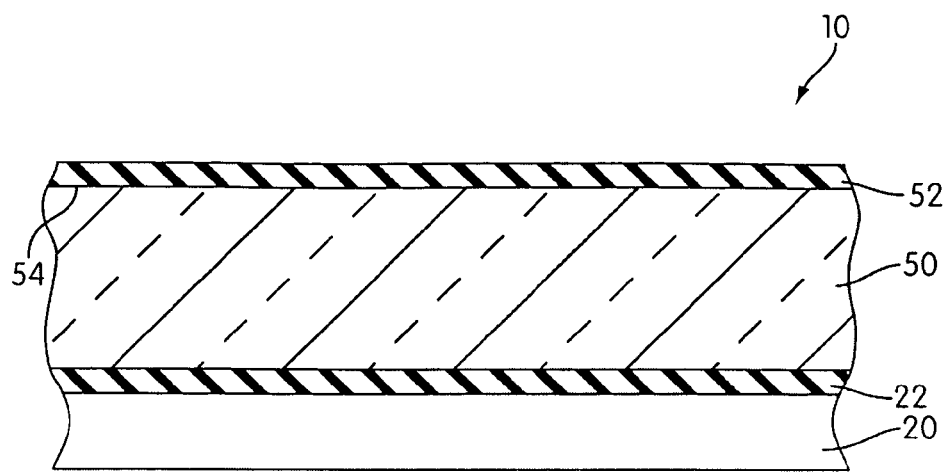
FIG. 3 is a schematic cross-sectional view of the portion shown in FIG. 1 illustrating a polysilicon and oxide layer deposition step and a buffer layer production step.

In a step 210 illustrated in FIG. 3, a layer 50 of conductive or semiconductive material is provided above or over a layer 22 of dielectric material, which is in turn provided above a silicon wafer 20. Layer 50 may be any of a variety of materials suitable for use in a conductive line or gate structure (e.g., metal, polysilicon, polysilicon/germanium ($Si_xGe_{(1-x)}$, etc.) and may be doped or undoped. Layer 22 may be any of a variety of materials suitable for use as a gate dielectric material (e.g., silicon dioxide, silicon nitride, etc.). In an exemplary embodiment, layer 50 is polysilicon deposited by chemical vapor deposition and layer 22 is silicon dioxide thermally grown on silicon substrate 20. In an alternative embodiment, layer 50 may include multiple layers of material, one or more of which may include polysilicon.

In an exemplary embodiment, layer 50 has a thickness of between approximately 1,500 and 2,000 angstroms and layer 22 has a thickness of between approximately 50 and 250 angstroms. In an alternative embodiment, layer 50 has a thickness of between approximately 1,000 and 2,500 angstroms and layer 22 has a thickness of between approximately 10 and 250 angstroms. Alternatively, layer 22 can be other types of materials used in the formation of narrow lines or structures.

In a step 220, a buffer or spacer layer 52 is formed on the top or upper surface 54 of layer 50. Buffer layer 52 can be made of any dielectric material (e.g., silicon dioxide ($SiO_2$), silicon nitride (SiN), silicon oxynitride (SiON), silicon-rich oxide, silicon-rich nitride, etc.). The thickness of buffer layer 52 may vary depending on various processing conditions. In an exemplary embodiment, the thickness of buffer layer 52 is between approximately 50 and 250 angstroms. In alternative embodiments, the thickness of the buffer layer may have a different thickness. For example, the thickness of the buffer layer may be greater than approximately 250 angstroms (e.g., between approximately 250 and 300 angstroms) or less than approximately 50 angstroms (e.g., between approximately 30 and 50 angstroms).

In an exemplary embodiment, buffer layer 52 comprises silicon oxynitride (SiON) and is deposited using a plasma-enhanced chemical vapor deposition (PECVD) process at an atmosphere including one or more of $SiH_4$, $N_2O$, $N_2$. The PECVD process is performed at a temperature of between approximately 250° and 500° C., a pressure of between approximately 5 and 100 torr, a flow rate of between approximately 20 and 700 SCCM, and a plasma power of between approximately 50 and 300 watts. Various modifications to the PECVD process can be made to alter the properties of the buffer layer (e.g., the thickness, temperature, pressure, flow rate, power, and other parameters may be adjusted as desired). In this manner, a buffer layer having an internal stress profile tailored to a specific application may be produced.

In an alternative embodiment, the buffer layer may be thermally grown on the surface of the polysilicon layer using a wet or dry oxidation process. For example, in an exemplary embodiment, the buffer layer may be a thermally grown oxide produced at a temperature of between approximately 700 and 1000° C. and a pressure of between approximately 400 and 760 torr. Oxygen is introduced at a flow rate of between approximately 1 and 5 liters per minute. In an alternative embodiment, a wet oxidation process may be used. In another alternative embodiment, an oxidation process may be used to form the buffer layer in which nitrogen may be introduced into the buffer layer. For example, a nitrogen-containing buffer layer may be produced by using an $N_2$ plasma with similar conditions as described above.

One advantageous feature of providing buffer layer 52 above top surface 54 of layer 50 is that internal stresses in an overlying amorphous carbon layer 60 may be compensated for or modulated. For example, where the internal stress of the amorphous carbon layer is generally compressive, buffer layer 52 may be formed in a manner that inhibits warpage that may result in the amorphous carbon layer, as by creating a buffer layer that has an internal stress profile that is generally tensile in nature or has a lesser degree of internal compressive stress than the amorphous carbon layer. This allows the degree of stress mismatch between the amorphous carbon layer and an underlying polysilicon layer to be "buffered" by the presence of a stress-relieving buffer layer.

Figure 4:
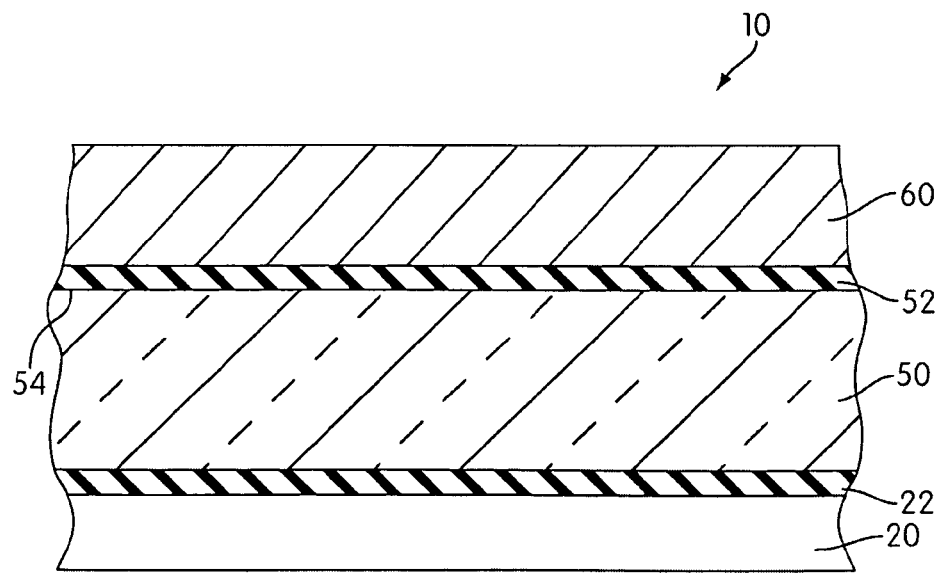
FIG. 4 is a schematic cross-sectional view of the portion shown in FIG. 1 illustrating an amorphous carbon layer deposition step.

In a step 230 shown in FIG. 4, a layer or film 60 of mask material comprising amorphous carbon is deposited above or over polysilicon layer 50. Layer 60 is deposited in a plasma-enhanced chemical vapor deposition (PECVD) process using an atmosphere including hydrocarbons such as ethylene, propylene, methane, and the like. The PECVD process is performed at a temperature of between approximately 400° and 550° C. and a pressure of between approximately 5 and 10 torr with a plasma power of between approximately 800 and 1,500 watts.

In a preferred embodiment, amorphous carbon layer 60 has a thickness of between approximately 500 and 700 angstroms. In alternative embodiments, the thickness of amorphous carbon layer 60 may vary depending on various design considerations. For example, the amorphous carbon layer may have a thickness of less than 500 angstroms (e.g., between 300 and 500 angstroms or less). In another alternative embodiment, the amorphous carbon layer may have a thickness of greater than 700 angstroms (e.g., between 700 and 900 angstroms or greater).

One advantageous feature of providing an amorphous carbon layer that may be produced with various thicknesses is that the amorphous carbon layer may be produced in a thickness suitable for patterning polysilicon layer 50. For example, where a particular thickness of polysilicon is provided, the thickness of the amorphous carbon layer may be altered so that the proper amount of mask material is provided over the polysilicon material to compensate for the etch selectivities of the materials used. This allows for increased manufacturing efficiency by eliminating unnecessary material use.

In a preferred embodiment, amorphous carbon layer 60 is deposited above polysilicon layer 50 in a pure or undoped form. In an alternative embodiment, the amorphous carbon layer may be deposited with nitrogen incorporated therein. For example, the amorphous carbon layer as deposited may include between approximately 0 and 10 atomic percent nitrogen. To deposit a nitrogen-containing amorphous carbon layer, a PECVD process using an atmosphere of hydrocarbons and nitrogen is used. To achieve a doping concentration of approximately 6 atomic percent nitrogen, for example, a flow ratio approximately 1:10 is used for the hydrocarbon to nitrogen gas flow rate (e.g., 300 cubic centimeters of hydrocarbon per minute to 3 liters of nitrogen per minute). In alternative embodiments, various other nitrogen concentrations may be achieved by varying the various processing conditions (e.g., increasing or decreasing the gas flow ratio of hydrocarbon to nitrogen, etc.).

In another alternative embodiment, an inert ion species may be implanted or introduced into the amorphous carbon layer. In this embodiment, the inert ions may be implanted at an energy between approximately 5 and 40 keV to a concentration of between approximately 1 and 10 atomic percent. The implantation of ions into the amorphous carbon layer may be performed in both nitrogen-doped and undoped amorphous carbon layers. Any of a variety of inert ions may be introduced or implanted into the amorphous carbon layer, including helium (He), argon (Ar), neon (Ne), krypton (Kr), xenon (Xe), and radon (Rn). Additionally, more than one inert ion species may be introduced into the amorphous carbon layer. For example, both helium and xenon ions may be implanted into the amorphous carbon layer. Other combinations are also possible in various alternative embodiments.

In yet another alternative embodiment, only a portion of the amorphous carbon layer is doped with nitrogen and/or an inert ion species. For example, a top portion of the amorphous carbon layer may be doped, while a bottom portion of the amorphous carbon layer may comprise pure or undoped amorphous carbon. In another example, the amorphous carbon layer may include alternating layers of doped and undoped amorphous carbon material.

One advantageous feature of doping the amorphous carbon layer with nitrogen and/or inert ions is that the doping may act to relieve or reduce the internal stress of the amorphous carbon layer. For example, where the internal stress of the amorphous carbon layer is generally compressive, the introduction of nitrogen or inert ions into the amorphous carbon layer may reduce the compressive stress or change the internal stress to tensile stress. By altering the stress profile of the amorphous carbon layer, better shape integrity of patterns formed in the amorphous carbon layer, and hence in the underlying material layer, may be obtained. For example, where the amorphous carbon layer is patterned to form a mask for creating a conductive line in an underlying material layer, reduced or altered internal stresses in the amorphous carbon mask may allow the mask to better retain its shape during processing, thus allowing the formation of conductive lines that do not exhibit warpage or wiggle characteristics.

Figure 5:
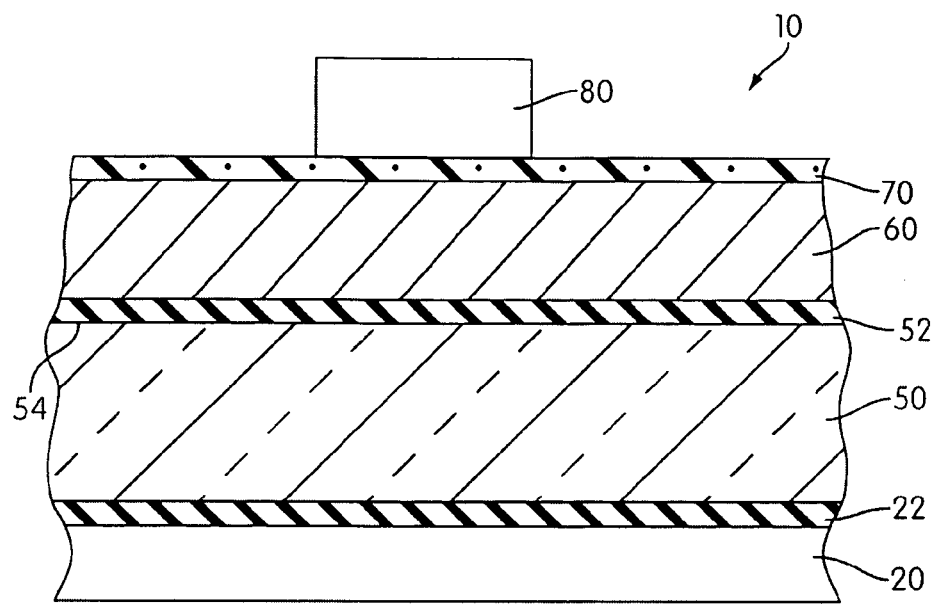
FIG. 5 is a schematic cross-sectional view of the portion shown in FIG. 1 illustrating an anti-reflective coating (ARC) layer deposition and mask formation step.

To further compensate or manage the internal stress characteristics of amorphous carbon layer 60, a cap layer 70 is provided or deposited above amorphous carbon layer 60 in a step 240 shown in FIG. 5. To facilitate the description below, amorphous carbon layer 60 will be described with reference to the preferred embodiment described above, in which a layer of amorphous carbon is deposited in pure form (i.e., without nitrogen or inert ions being incorporated therein). Amorphous carbon layer 60 can be formed in any of a variety of ways depending on the desired amorphous carbon layer properties, as described above with regard to the various alternative embodiments.

Cap layer 70 may be formed of an anti-reflective material to form an anti-reflective coating (ARC) layer. Cap layer 70 may include silicon nitride (SiN), silicon oxynitride (SiON), silicon-rich oxide (e.g., non-stoichiometric oxide-containing silicon material), silicon-rich nitride, and the like. In an exemplary embodiment, cap layer 70 has a thickness of between approximately 50 and 200 angstroms. One advantageous feature of using a cap layer formed from an anti-reflective material is that the amorphous carbon layer will be protected during deposition and exposure of a photoresist material above amorphous carbon layer 60 and that reflection of ultraviolet (UV) rays used in the exposure of the photoresist will be reduced.

In a step 250, a layer of photoresist material is deposited above or over cap layer 70 (e.g., by spin-coating) and exposed to form a photoresist feature 80. The layer of photoresist is deposited by spin coating at a thickness of between approximately 200 and 400 angstroms and is patterned to have a width of between approximately 40 and 100 nanometers. Any of a variety of photoresist materials may be used, including photoresist materials that may be etched using UV rays having wavelengths of 193 or 248 nanometers.

Figure 6:
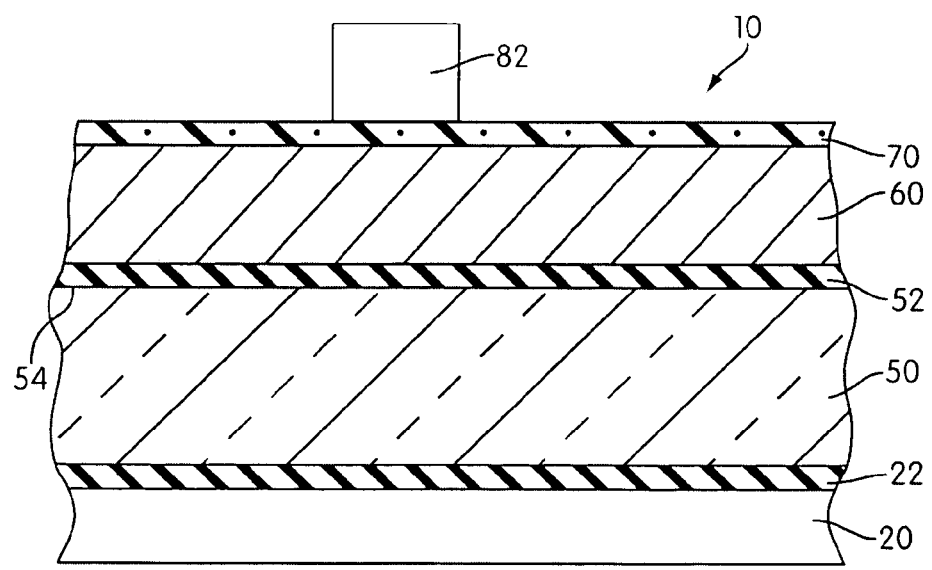
FIG. 6 is a schematic cross-sectional view of the portion shown in FIG. 1 illustrating a mask trimming step.

In a step 260 shown in FIG. 6, photoresist feature 80 is trimmed to form a photoresist mask 82 having reduced dimensions. Trimming is accomplished by oxidizing the photoresist feature and removing the oxidized portion, which results in a photoresist mask having reduced dimensions. The thickness of the photoresist mask formed may depend on the trim rate. For example, in an exemplary embodiment, a trim etching step may erode or remove between approximately 3 to 4 nanometers per second in the vertical direction and between approximately 1.5 and 2.5 nanometers per second in the lateral direction. Other trim rates may be used, and may depend on the type of photoresist material used. Process 200 is particularly advantageous when narrow gate conductors are formed when using trim etching techniques. In an exemplary embodiment, photoresist mask 82 has a thickness of between approximately 2000 and 6000 angstroms and a width of approximately 40 and 60 nanometers after trim etching.

Figure 7:
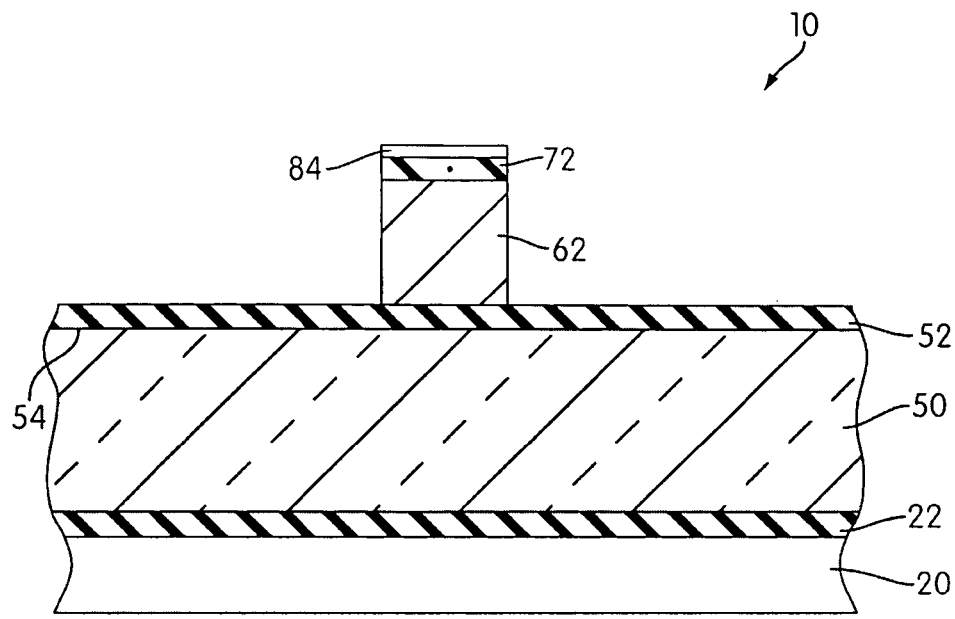
FIG. 7 is a schematic cross-sectional view of the portion shown in FIG. 1 illustrating a first step in the formation of an amorphous carbon ARC mask.

In a step 270 shown in FIG. 7, photoresist mask 82 is used as a mask to pattern cap layer 70 to form a cap feature 72. A small amount of photoresist material 84 remains through the etching and overetching of cap layer 70. In an exemplary embodiment, cap layer 70 is etched using a fluorine-based plasma (e.g., $CF_4$, $CF_4/CHF_3$, etc.). The etching is performed in an argon or helium atmosphere at a temperature of between approximately 10° and 40° C. and a pressure of approximately 10 millitorr.

In a step 280, cap feature 72 is used as a mask to pattern amorphous carbon layer 60 to form amorphous carbon feature 62. In an exemplary embodiment, amorphous carbon layer 60 is etched using an oxygen-based plasma at a temperature of between approximately 40° and 60° C. and a pressure of between approximately 3 and 10 millitorr. For example, the plasma used may be an oxygen-hydrogen-bromide plasma, an oxygen-nitrogen plasma, an oxygen-$CHF_3$ plasma, and the like. Argon may also be present in the atmosphere. The plasma power may be adjusted so that the ion density power is between approximately 800 and 1,200 watts and the ion energy control is between approximately 50 and 200 watts.

Using the plasma etch method described above, amorphous carbon feature 62 is formed without the introduction of aqueous etchants, which may damage or destroy feature 62 as processing proceeds. For example, the use of phosphoric acid as an etchant is eliminated by using amorphous carbon, since portions of the amorphous carbon layer may be removed using a plasma etch.

Figure 8:
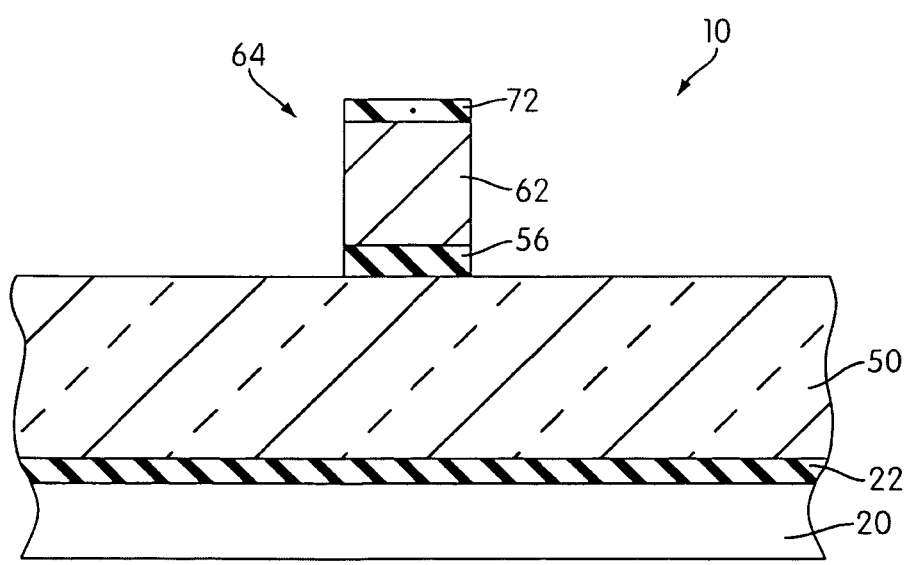
FIG. 8 is a schematic cross-sectional view of the portion shown in FIG. 1 illustrating a breakthrough etch step that completes the formation of an amorphous carbon ARC mask.
Figure 9:
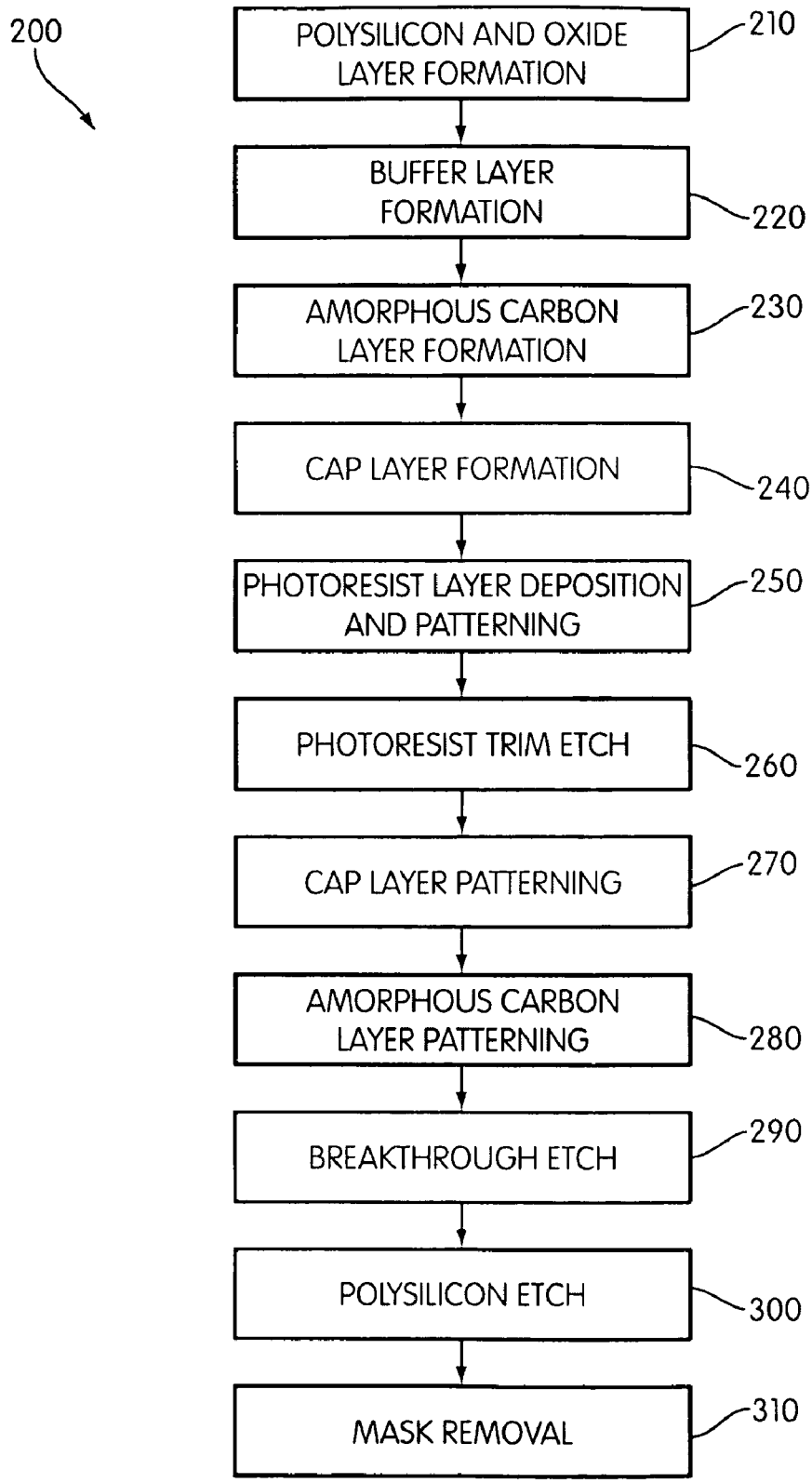
FIG. 9 is a flow diagram illustrating the process of forming structures in an integrated circuit.

In a step 290 shown in FIG. 8, a breakthrough etch is performed to remove a portion of buffer layer 52 from surface 54 of polysilicon layer 50 prior to patterning polysilicon layer 50. A buffer feature 56 is thus formed intermediate or between polysilicon layer 50 and amorphous carbon feature 62. The breakthrough etch also removes any remaining photoresist material 84 located on top of cap feature 72.

In an exemplary embodiment where buffer layer 52 comprises silicon oxynitride, the portion of buffer layer 52 that is uncovered by amorphous carbon feature 62 and cap feature 72 is removed using a reactive ion etch with an etchant such as $CF_4$, $CHF_3$, or the like at a temperature of between approximately 100 and 60° C. and a pressure of between approximately 5 and 20 millitorr.

Buffer feature 56, amorphous carbon feature 62, and cap feature 74 together comprise an amorphous carbon ARC mask 64. In an exemplary embodiment, amorphous carbon ARC mask 64 has a width of between approximately 30 and 60 nanometers. In alternative embodiments, the amorphous carbon ARC mask may have a width of less than 30 nanometers (e.g., 10-25 nanometers, etc.) or greater than 60 nanometers (e.g., 60-80 nanometers, etc.).

In a step 300, amorphous carbon ARC stack 64 is used to pattern or form features in polysilicon layer 50. For example, polysilicon layer 50 may be etched to form conductive line 30 (shown in FIG. 1). The polysilicon etch is performed using an $HBr/Cl_2/HeO_2/CF_4$ mixture at a temperature of between approximately 40 and 70° C. and a pressure of between approximately 3 and 10 millitorr.

In a step 310, amorphous carbon ARC stack 64 is removed after polysilicon layer 50 is patterned (e.g., to form conductive line 30 shown in FIG. 1). The constituents of amorphous carbon ARC stack 64 may be removed using methods similar to those described above. For example, the ARC portion of amorphous carbon ARC stack 64 may be removed using a fluorine-based plasma (e.g., $CF_4$, $CF_4/CHF_3$, etc.). The amorphous carbon portion of amorphous carbon ARC stack 64 may be removed using an oxygen-containing plasma to expose the top surface of conductive line 30. In subsequent processing steps, other material layers and devices may be added to portion 10 to form a complete integrated circuit.

While the exemplary embodiments illustrated in the FIGURES and described above are presently preferred, it should be understood that these embodiments are offered by way of example only. Other embodiments may include, for example, different methods of depositing the various layers above the substrate, different combination of times, temperatures, pressures, and the like. The invention is not limited to a particular embodiment, but extends to various modifications, combinations, and permutations that nevertheless fall within the spirit and scope of the appended claims.

What is claimed is:

1. A method of forming an integrated circuit comprising:
   providing a buffer layer above a layer of conductive material, the buffer layer comprising a dielectric material;
   providing a layer of mask material above the buffer layer, the mask material comprising amorphous carbon;
   providing a layer of anti-reflective coating (ARC) material above the layer of mask material, the layer of ARC material formed of a different material than the mask material;
   providing a patterned photoresist material above the ARC material;
   removing a portion of the buffer layer and the layer of mask material in accordance with the patterned photoresist material to form a mask;
   removing completely the patterned photoresist material; and
   forming a feature in the layer of conductive material according to the mask after removing completely the patterned photoresist material.

2. The method of claim 1, further comprising removing a portion of the layer of ARC material.

3. The method of claim 1, wherein at least one of the steps of providing a buffer layer and providing a layer of mask material comprises using a plasma-enhanced chemical vapor deposition (PECVD) process.

4. The method of claim 1, wherein the buffer layer is formed using a thermal oxidation process.

5. The method of claim 1, wherein the buffer layer has a thickness of between approximately 10 and 250 angstroms.

6. The method of claim 1, wherein the step of removing a portion of the buffer layer and the layer of mask material comprises using an oxygen-based plasma.

7. The method of claim 1, wherein the buffer layer comprises silicon dioxide.

8. The method of claim 1, wherein the mask material further comprises a dopant material selected from nitrogen, helium, argon, neon, krypton, radon, and xenon.

9. The method of claim 1, wherein the feature is a gate conductor having a width of less than approximately 50 nanometers.

10. The method of claim 1, wherein the layer of mask material has a thickness of between approximately 500 and 700 angstroms.

11. The method of claim 1, wherein the layer of mask material includes internal stresses and the buffer layer has a thickness sufficient to compensate for at least a portion of the internal stresses in the layer of mask material.

12. A method of forming features in an integrated circuit comprising:
   forming a mask above a layer of polysilicon, the mask including a first region comprising a dielectric material, a second region comprising amorphous carbon above the first region, and a third region comprising an anti-reflective coating (ARC) material above the second region, the second region having a thickness of between approximately 500 and 700 angstroms;
   forming a feature in the layer of polysilicon according to the mask; and
   removing the mask;
   wherein the third region does not comprise amorphous carbon.

13. The method of claim 12, wherein the first region has a thickness of between approximately 50 and 250 angstroms.

14. The method of claim 12, wherein the dielectric material comprises silicon dioxide.

15. The method of claim 12, wherein the step of forming a mask comprises depositing a first layer comprising dielectric material, a second layer comprising amorphous carbon, and a third layer comprising ARC material and etching the first, second, and third layers.

16. The method of claim 15, wherein the second layer and at least one of the first and third layers are deposited using a plasma-enhanced chemical vapor deposition (PECVD) process.

17. The method of claim 15, wherein the step of forming a mask comprises forming a photoresist mask above the third layer and trimming the photoresist mask.

18. The method of claim 17, further comprising removing completely the photoresist mask before the step of forming a feature in the layer of polysilicon.

19. The method of claim 12, wherein the mask has a width of between approximately 30 and 50 nanometers.

20. The method of claim 12, wherein the second region includes internal stresses and the dielectric material has a thickness sufficient to compensate for at least a portion of the internal stresses in the second region.

21. A method of forming an integrated circuit comprising:
   providing a conductive material layer above a semiconductor substrate;
   forming a layer of buffer material above the conductive material layer, the buffer material comprising a dielectric material;
   providing an ARC layer above the layer of buffer material;
   depositing a layer of amorphous carbon material having a thickness of between approximately 500 and 700 angstroms above the layer of buffer material, the layer of amorphous carbon material comprising a different material than the ARC layer;
   etching the amorphous carbon layer and the layer of buffer material to form a hard mask in accordance with a patterned photoresist layer; and
   etching the conductive material layer according to the hard mask after completely removing the patterned photoresist layer.

22. The method of claim 21, wherein the dielectric layer comprises silicon dioxide.

23. The method of claim 21, wherein the step of forming a layer of buffer material comprises using a plasma-enhanced chemical vapor deposition (PECVD) process.

24. The method of claim 21, wherein the layer of buffer material comprises nitrogen.

25. The method of claim 21, wherein the amorphous carbon material includes internal stresses and the dielectric material has a thickness sufficient to compensate for at least a portion of the internal stresses in the amorphous carbon material.

26. The method of claim 25, wherein the thickness of the dielectric material is between approximately 10 and 250 angstroms.

* * * * *

UNITED STATES PATENT AND TRADEMARK OFFICE
CERTIFICATE OF CORRECTION

| | | |
|---|---|---|
| PATENT NO. | : 7,521,304 B1 | Page 1 of 1 |
| APPLICATION NO. | : 10/230775 | |
| DATED | : April 21, 2009 | |
| INVENTOR(S) | : Huang et al. | |

It is certified that error appears in the above-identified patent and that said Letters Patent is hereby corrected as shown below:

On the cover page,

Item [*] Notice: Subject to any disclaimer, the term of this patent is extended or adjusted under 35 USC 154(b) by 300 days Delete the phrase "by 300 days" and insert -- by 691 days --

Signed and Sealed this

Thirteenth Day of April, 2010

David J. Kappos
*Director of the United States Patent and Trademark Office*